(12) United States Patent
Yamamoto et al.

(10) Patent No.: US 12,733,434 B2
(45) Date of Patent: Sep. 8, 2026

(54) MEASUREMENT JIG AND PROCESSING METHOD

(71) Applicant: Tokyo Electron Limited, Tokyo (JP)

(72) Inventors: Masakazu Yamamoto, Iwate (JP); Tadashi Enomoto, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 765 days.

(21) Appl. No.: 17/804,671

(22) Filed: May 31, 2022

(65) Prior Publication Data

US 2022/0392791 A1 Dec. 8, 2022

(30) Foreign Application Priority Data

Jun. 8, 2021 (JP) ................................ 2021-096190

(51) Int. Cl.
*H10P 72/00* (2026.01)
*H10P 72/50* (2026.01)

(52) U.S. Cl.
CPC .......... *H10P 72/0606* (2026.01); *H10P 72/50* (2026.01)

(58) Field of Classification Search
None
See application file for complete search history.

(56) References Cited

U.S. PATENT DOCUMENTS

2003/0139852 A1* 7/2003 Kataoka .............. H01L 21/6875 700/258
2006/0150906 A1* 7/2006 Selen ................ H01L 21/67303 118/728
2019/0325601 A1* 10/2019 Chen ...................... B25J 9/1697
2022/0254666 A1* 8/2022 Sadeghi ............ H01L 21/68742

FOREIGN PATENT DOCUMENTS

JP 2003-218186 7/2003
JP 2019-209688 12/2019
WO 2019/209688 10/2019
WO 2021/022291 2/2021

* cited by examiner

*Primary Examiner* — Kara E. Geisel
*Assistant Examiner* — Chad Andrew Reverman
(74) *Attorney, Agent, or Firm* — IPUSA, PLLC

(57) ABSTRACT

A measurement jig for measuring the conditions in a device and a processing method are provided. A measurement jig having a substrate, a back-surface camera provided on a back-surface side of the substrate, and a controller configured to control the back-surface camera.

10 Claims, 9 Drawing Sheets

10
C
14
16
12
30
31
32
33
34
35
S1
S2
6
24
4
7
8
60
61
62
63
64
65
80
81
82
50
52
54
W
2
104
102
103

C
14
18
14
10
31
30
35
34
33
32
S1
12
24
18
6
8
4
SECOND HORIZONTAL DIRECTION
FIRST HORIZONTAL DIRECTION
64
60
61
63
62
S2
81
2
80
103
102
104

FRONT
RIGHT
LEFT
REAR
101
110
121
122
123
124
125
126
140
151
152
160
170
201
202
203
63
631
632

101
110
203
134
631
633
63
135
122
131
201
133
132
202
632
LEFT
REAR
FRONT
RIGHT

MEASUREMENT JIG AND PROCESSING METHOD

BACKGROUND OF THE INVENTION

1. Field of the Invention

This disclosure relates to a measurement jig and a processing method.

2. Description of the Related Art

Patent Document 1 discloses a position teaching device having a disk of approximately the same size as a wafer, and a camera mounted on the disk so that the part below the disk can be checked visually through a through hole formed in the disk.

RELATED-ART DOCUMENTS

Patent Document

[Patent Document 1] Japanese Unexamined Patent Application Publication No. 2003-218186

Now, when wafers are transferred by using a transfer device, it is not possible to transfer the wafers strictly in accordance with the design values, due to mechanical variation, variation that is introduced upon installation of devices, and/or other factors. Therefore, there is a need for a jig for measuring the mechanical variation that lies between the design values and actual devices.

SUMMARY OF THE INVENTION

One aspect of the present disclosure therefore provides a measurement jig and a processing method for measuring the conditions inside a device.

That is, according to one aspect of the present disclosure, a measurement jig having a substrate, a back-surface camera provided on a back-surface side of the substrate, and a controller configured to control the back-surface camera, is provided.

According to one aspect of the present disclosure, a measurement jig and a processing method are thus provided.

DESCRIPTION OF THE PREFERRED EMBODIMENTS

Now, an embodiment for carrying out the present disclosure will be described below with reference to the accompanying drawings. In each drawing, the same components will be assigned the same reference signs, and redundant description may be omitted.

<Substrate Processing System>

Figure 1:
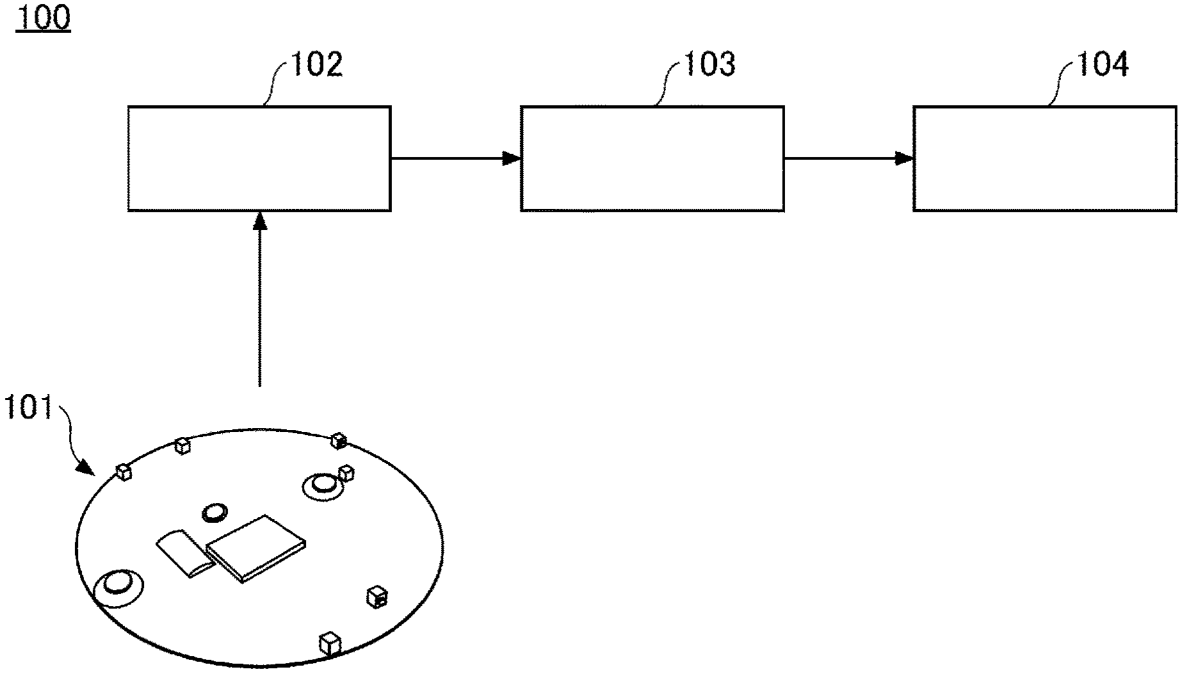
FIG. 1 is an example structure diagram of a substrate processing system according to an embodiment.

First, a substrate processing system 100 according to an embodiment of the present disclosure will be described with reference to FIG. 1. FIG. 1 is a structure diagram of the substrate processing system 100 according to the embodiment. The substrate processing system 100 has a measurement jig 101, an analysis controller 102, a device controller 103, and a substrate processing device 104.

The measurement jig 101 is configured to perform wireless data communication with the analysis controller 102. Also, the measurement jig 101 is configured so that it can be transferred by using a transfer device (a wafer transfer device 60, which will be described later) included in the substrate processing device 104 for transferring semiconductor wafers, which are substrates (hereinafter referred to as "wafer(s) W" (see FIG. 2, which will be described later)). The measurement jig 101 has functions for detecting data by using a variety of sensors (front surface cameras 121 to 126, back-surface cameras 131 to 135, a level 140, and vibration sensors 151 and 152, which will be described later), performing a primary analysis of the data by using a built-in controller (a (a jig controller 160, which will be described later), stocking the data on a temporary basis, and transmitting the data to the analysis controller 102.

The analysis controller 102 is communicably connected with the measurement jig 101 and the device controller 103. The analysis controller 102 analyzes the data, commands the operation of the device controller 103, stocks the data, commands the operation of the measurement jig 101, commands the start of the analysis, commands the end of the analysis, and so forth. Also, the analysis controller 102 is configured as a digital twin system and implements a CPS (Cyber Physical System).

The device controller 103 is communicably connected with the analysis controller 102 and the substrate processing device 104. The device controller 103 is a device to control (to command the operation of) the entirety of the substrate processing device 104, based on operation commands from the analysis controller 102. The device controller 103 also has a function of transmitting the data of the substrate processing device 104 to the analysis controller 102.

The substrate processing device 104 is a device to perform predetermined processes (for example, heat treatment) on the wafers W (see FIG. 2, which will be described later).

Note that, although FIG. 1 illustrates a structure in which the analysis controller 102 and the device controller 103 are provided separately, this is by no means limiting, and the device controller 103 may have the functions of the analysis controller 102.

Next, an example structure of the substrate processing device 104 included in the substrate processing system 100 according to one embodiment will be described below with reference to FIG. 2 and FIG. 3. FIG. 2 is an example cross-sectional view illustrating a structure of the substrate processing device 104 included in the substrate processing system 100 according to the embodiment. FIG. 3 is an example plan view illustrating a structure of the substrate processing device 104 included in the substrate processing system 100 according to the embodiment.

The substrate processing device 104 is configured to be held in a housing 2, which constitutes the exterior body of the device. A carrier transfer space S1 and a wafer transfer space S2 are formed inside the housing 2. The carrier transfer space S1 and the wafer transfer space S2 are separated by a partition wall 4. In the partition wall 4, transfer openings 6 for communicating between the carrier transfer space S1 and the wafer transfer space S2 and transferring the wafers W are provided. Each transfer opening 6 is opened and closed by a door mechanism 8 that complies with an FIMS (Front-Opening Interface Mechanical Standard). The door mechanism 8 is connected with the drive mechanism for a cover opening/closing device 7, and the door mechanism 8 is configured to move forward, backward, upward, and downward, by means of the drive mechanism, thereby opening and closing the transfer opening 6.

Hereinafter, the direction in which the carrier transfer space S1 and the wafer transfer space S2 are provided will be defined as the front-rear direction (corresponding to the second horizontal direction in FIG. 3), and the horizontal direction that is perpendicular to the front-rear direction will be defined as the left-right direction (corresponding to the first horizontal direction in FIG. 3).

The carrier transfer space S1 is a space under an air atmosphere. The carrier transfer space S1 is a space for transferring the carriers C, in which the wafers W are contained, between the components in the substrate processing device 104, which will be described later, carrying in the carriers C from outside to the substrate processing device 104, and carrying out the carriers C from the substrate processing device 104 to the outside. The carriers C may be, for example, FOUPs (Front-Opening Unified Pods). By keeping a predetermined level of cleanliness inside the FOUPs, it is possible to prevent, for example, foreign matter from adhering to the front surface of the wafers W, natural oxide films from forming, and so forth. The carrier transfer space S1 is composed of a first transfer space 10 and a second transfer space 12, located behind the first transfer space 10 (nearer to the wafer transfer space S2).

In the first transfer space 10, for example, two load ports 14 are provided on upper and lower levels (see FIG. 2), and two load ports 14 are provided on the left and right on each level (see FIG. 3). When a carrier C is carried into the substrate processing device 104, each load port 14 serves as a stage for carrying in and receiving the carrier C. The load ports 14 are provided in places where the wall of the housing 2 is open, so that the substrate processing device 104 can be accessed from outside. To be more specific, a transfer device (not shown) provided outside the substrate processing device 104 can carry in and load the carriers C on the load ports 14, and carry out the carriers C from the load ports 14 to the outside (not shown). Also, the load ports 14 are provided, for example, on two levels, high and low, so that it is possible to carry in and out the carriers C in both load ports 14. In the lower-level load port 14, stockers 16 may be provided for stocking the carriers C. On the surface of each load port 14 where the carriers C are loaded, positioning pins 18 for positioning the carriers C are provided at, for example, three positions. Also, each load port 14 may be configured to be able to move forward and backward while the carriers C are loaded on the load port 14.

Figure 2:
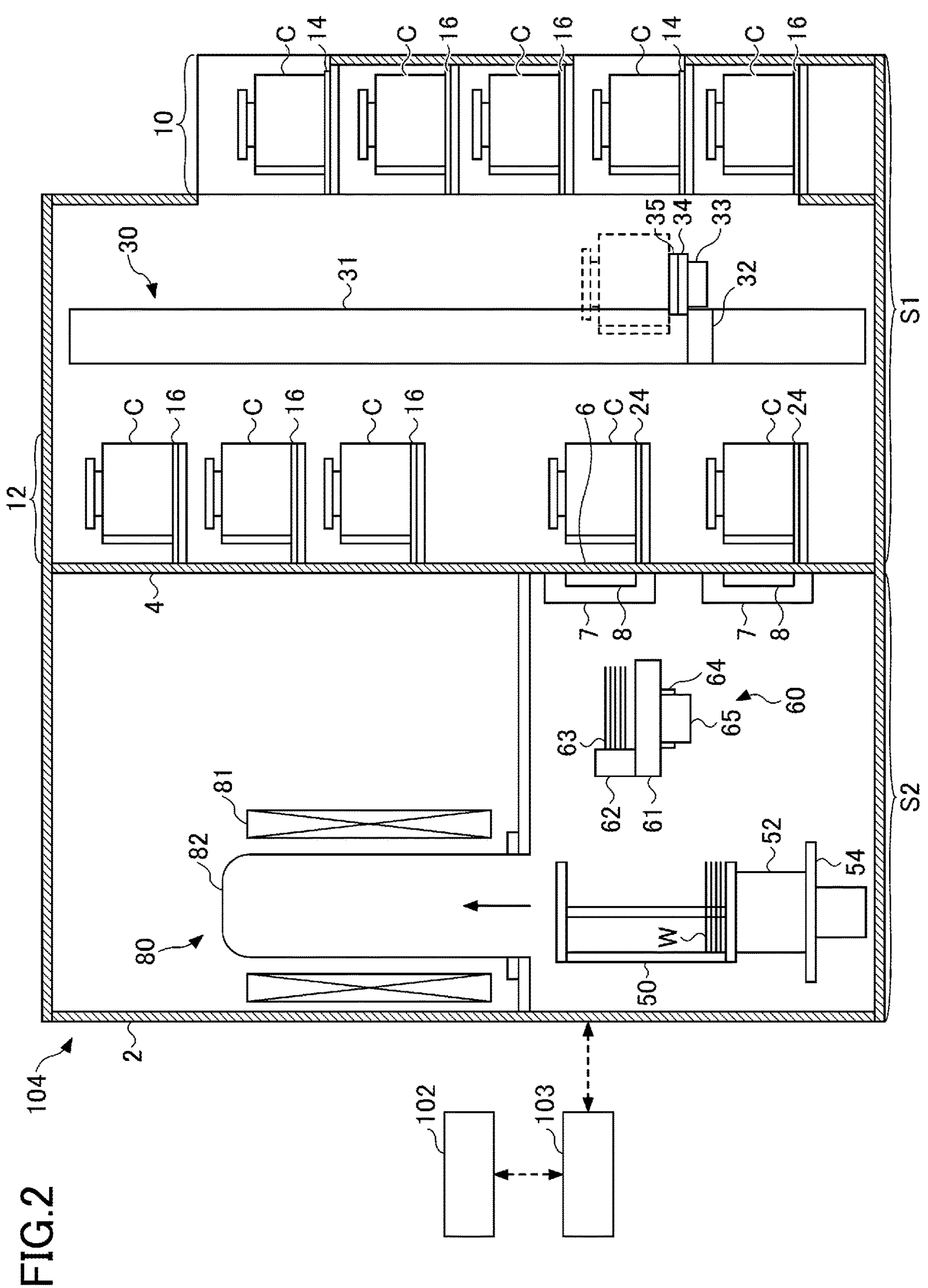
FIG. 2 is an example cross-sectional view illustrating a structure of a substrate processing device included in the substrate processing system according to the embodiment.
Figure 3:
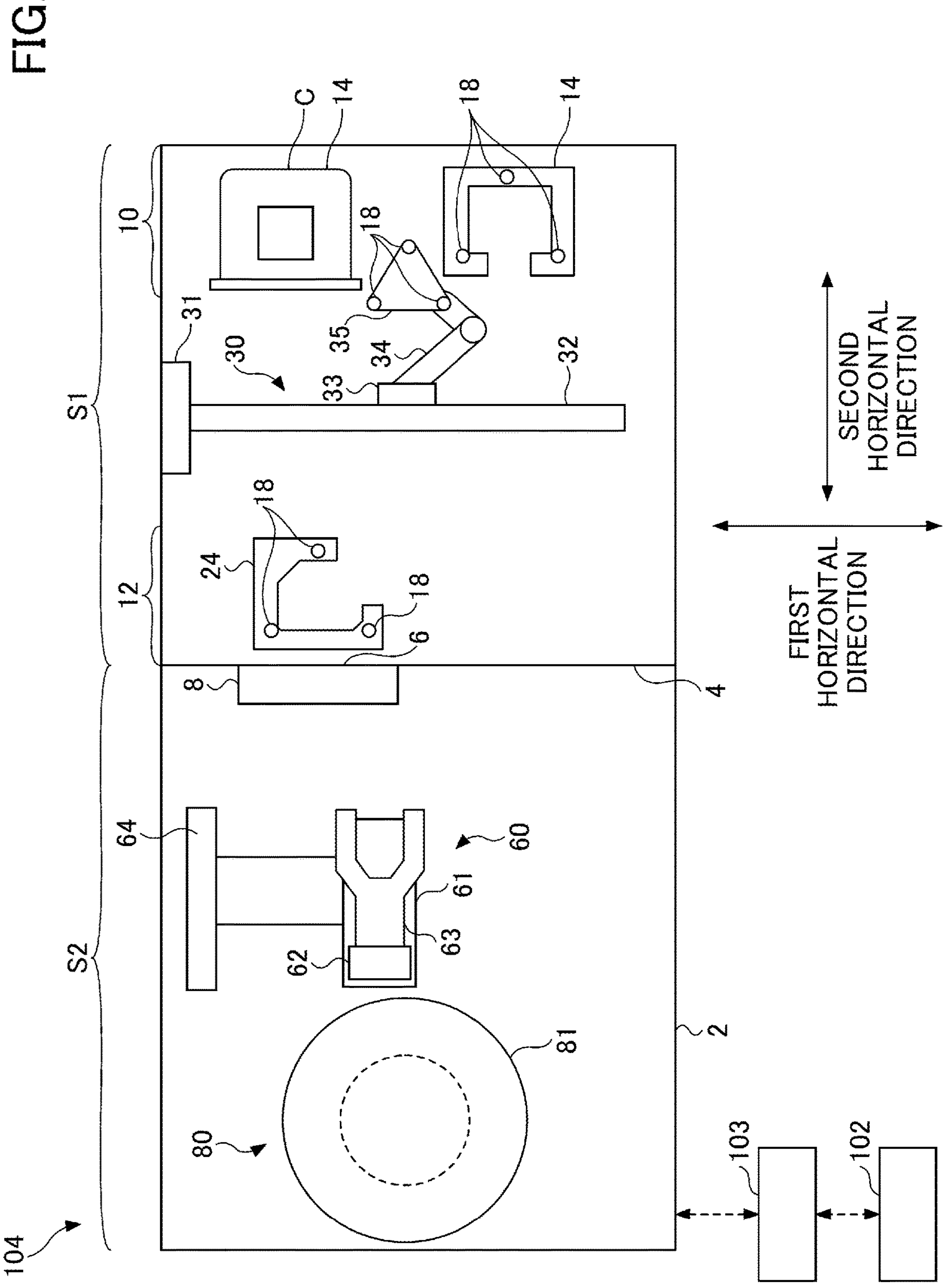
FIG. 3 is an example plan view illustrating a structure of the substrate processing device included in the substrate processing system according to the embodiment.

In the lower part of the second transfer space 12, two FIMS ports 24 are placed in the up-down direction, one next to the other (see FIG. 2). The FIMS ports 24 are holding tables for holding the carriers C, when the wafers W in the carriers C are carried in and out of a heating furnace 80 in the wafer transfer space S2, which will be described later. The FIMS ports 24 are configured to be able to move forward and backward. Similar to the load ports 14, on the surface of each FIMS port 24 where the carriers C are loaded, positioning pins 18 for positioning the carriers C are provided.

In the upper part of the second transfer space 12, stockers 16 for stocking the carriers C are provided. The stockers 16 are composed of, for example, three shelves, and two or more carriers C can be loaded left and right on each shelf. Furthermore, the stockers 16 may be provided in the space in the lower part of the second transfer space 12 where no stage for carriers is provided.

Between the first transfer space 10 and the second transfer space 12, a carrier transfer mechanism 30 for transferring the carriers C among the load ports 14, the stockers 16, and the FIMS ports 24 is provided.

The carrier transfer mechanism 30 includes a first guide 31, a second guide 32, a moving portion 33, an arm 34, and a hand 35. The first guide 31 is configured to extend upwards and downwards. The second guide 32 is connected with the first guide 31, and configured to extend to the left and right (in the first horizontal direction). The moving portion 33 is configured to move to the left and right, being guided by the second guide 32. The arm 34 has one joint and two arms, and is provided in the moving portion 33. The hand 35 is provided at the tip of the arm 34. Pins 18 for positioning the carriers C are provided at three locations in the hand 35.

The wafer transfer space S2 is a space where the wafers W are taken out of the carriers C and subjected to a variety of processes. The wafer transfer space S2 has an inert gas atmosphere, such as, for example, a nitrogen ($N_2$) gas atmosphere, in order to prevent oxide films from forming on the wafers W. In the wafer transfer space S2, a vertical heating furnace 80, having its lower end open as a furnace opening, is placed.

The heating furnace 80 can hold the wafers W, and has a quartz cylindrical processing container 82 for heat-treating the wafers W. Cylindrical heaters 81 are provided around the processing container 82, and, by heating the heaters 81, the wafers W held in the processing container 82 are heat-treated. A shutter (not shown) is provided below the processing container 82. The shutter is a door for covering the lower end of the heating furnace 80 after the wafer boat 50 is carried out of the heating furnace 80, until the next wafer boat 50 is carried in. Below the heating furnace 80, a wafer boat 50, which is a substrate holder, is placed on the cover 54 via a heat insulating cylinder 52. In other words, the cover 54 is provided below the wafer boat 50 integrally with the wafer boat 50.

The wafer boat 50 is made of, for example, quartz, and is configured to keep the wafers W of a large diameter (for example, a diameter of 300 mm or 450 mm) substantially level, at predetermined intervals upwards and downwards. The number of wafers W to be held in the wafer boat 50 is not particularly limited, but may be, for example, 50 to 200. The cover 54 is supported by an elevator mechanism, and the wafer boat 50 is carried in or out of the heating furnace 80 by the elevator mechanism (not shown). A wafer transfer device 60 is provided between the wafer boat 50 and the transfer opening 6.

The wafer transfer device 60 transfers the wafers W between the carriers C held in the FIMS ports 24, and the wafer boat 50. The wafer transfer device 60 includes a guide mechanism 61, a moving body 62, forks 63, an elevator mechanism 64, and a rotating mechanism 65. The guide mechanism 61 has a rectangular-parallelepiped shape. The guide mechanism 61 is attached to the elevator mechanism 64, which extends vertically, and is configured to move vertically by means of the elevator mechanism 64 and to rotate by means of the rotating mechanism 65. The moving body 62 is provided on the guide mechanism 61 so as to move back and forth lengthwise. The forks 63 are transfer tools that are attached via the moving body 62, and multiple forks 63 (for example, five forks) are provided. By having multiple forks 63, multiple wafers W can be transferred at the same time, so that the time it takes to transfer wafers W can be shortened. However, it is equally possible to have only one fork 63.

Filters (not shown) may be provided in the ceiling or in the side walls of the wafer transfer space S2. Examples of filters include HEPA (High Efficiency Particulate Air) filters, ULPA (Ultra-Low Penetration Air) filters, and so forth. By providing filters, clean air can be supplied into the wafer transfer space S2.

<Measurement Jig>

Figure 4:
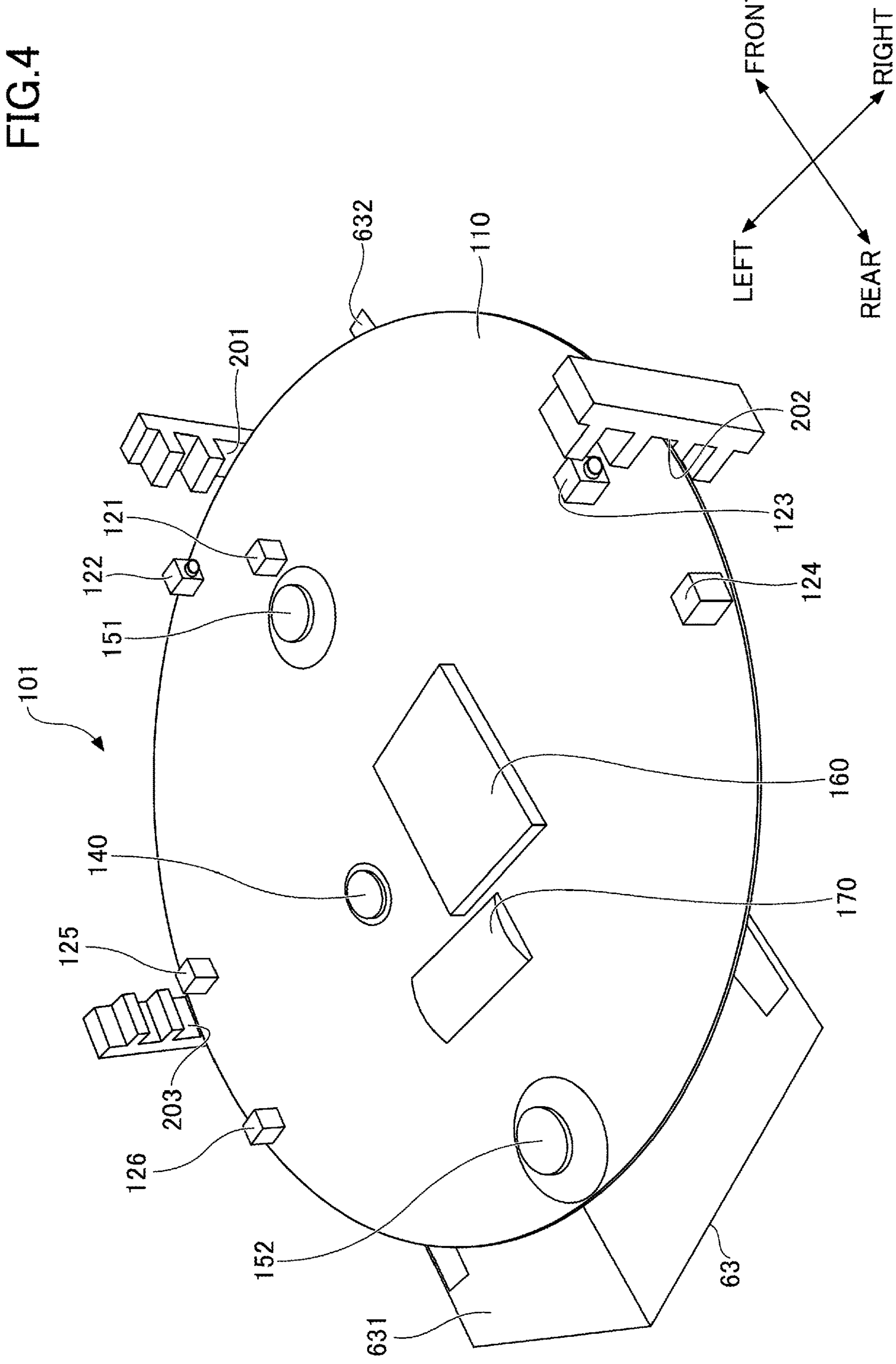
FIG. 4 is an example perspective view of a measurement jig seen from the front-surface side.
Figure 5:
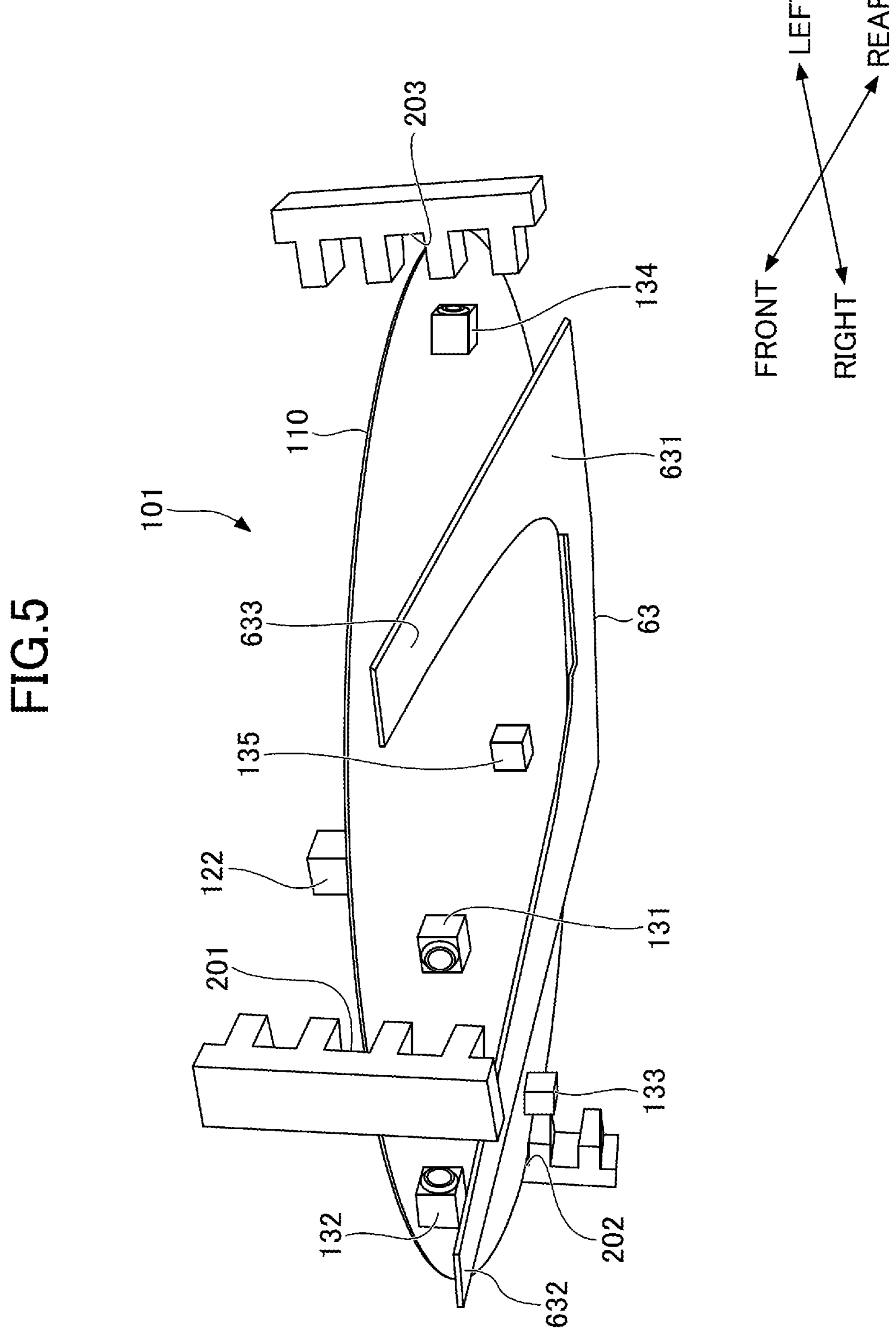
FIG. 5 is an example perspective view of the measurement jig seen from the back-surface side.

Next, the measurement jig 101 will be described below with reference to FIG. 4 and FIG. 5. FIG. 4 is an example perspective view of the measurement jig 101 seen from the front-surface side. FIG. 5 is an example perspective view of the measurement jig 101 seen from the back-surface side. Note that, in the state illustrated in FIG. 4 and FIG. 5, the measurement jig 101 is held in slots 201 to 203 of a carrier C (see FIG. 2) mounted on an FIMS port 24 (see FIG. 2), and a fork 63 of the wafer transfer device 60 (see FIG. 2) is inserted in the carrier C. Also, in the following description, the direction in which this fork 63 is inserted/removed is the front-rear direction, and the width direction of the forks 63 is the left-right direction.

The measurement jig 101 includes a substrate 110, front-surface cameras 121 to 126, back-surface cameras 131 to 135, a level 140, vibration sensors 151 and 152, a jig controller 160, and a battery 170.

The substrate 110 is formed as a disk having the same diameter as the wafers W. This allows the measurement jig 101 to be held in the carrier C or the wafer boat 50 in the same way as the wafers W are held. Note that, in the examples shown in FIG. 4 and FIG. 5, the measurement jig 101 is held by a slot 201 provided on the front-side inner-wall surface of the carrier C, a slot 202 provided on the right-side inner-wall surface of the carrier C, and a slot 203 provided on the left-side inner-wall surface of the carrier C. Also, the carrier C, in which the measurement jig 101 is held, can be transferred by the carrier transfer mechanism 30. Also, the measurement jig 101 can be transferred by the wafer transfer device 60.

The front-surface cameras 121 to 126, multiple in number, are placed on the front surface of the substrate 110. Here, the front surface of the substrate 110 is the surface facing upwards with respect to the direction of gravity that applies to the substrate 110. Also, the front surface of the substrate 110 is the surface that does not contact the wafer boat 50 or the carrier C when the substrate 110 is loaded on the wafer boat 50 or the carrier C. Also, the front surface of the substrate 110 is the surface that does not contact the fork 63 when the substrate 110 is loaded on the fork 63 and transferred.

For example, the front-surface camera 121 is placed in a front-side portion of the substrate 110, and captures an image of the front (the direction in which the fork 63 is inserted, and the direction to see the slot 201 from the front). The front-surface camera 122 is placed in a front-side portion of the substrate 110, and captures an image of the right (the direction to see the slot 201 from the side). The front-surface camera 123 is placed in a right-side portion of the substrate 110, and captures an image of the right (the direction to see the slot 202 from the front). The front-surface camera 124 is placed in a right-side portion of the substrate 110, and captures an image of the front (the direction in which the fork 63 is inserted, and the direction to see the slot 202 from the side). The front-surface camera 125 is placed in a left-side portion of the substrate 110, and captures an image of the left (the direction to see the slot 203 from the front). The front-surface camera 125 is placed in a left-side portion of the substrate 110, and captures an image of the front (the direction in which the fork 63 is inserted, and the direction to see the slot 203 from the side).

The back-surface cameras 131 to 135, multiple in number, are placed on the back surface of the substrate 110. Here, the back surface of the substrate 110 is the surface facing downwards with respect to the direction of gravity that applies to the substrate 110. Also, the front surface of the substrate 110 is the surface that does not contact the wafer boat 50 or the carrier C when the substrate 110 is loaded on the wafer boat 50 or the carrier C. Also, the front surface of the substrate 110 is the surface that does not contact the fork 63 when the substrate 110 is loaded on the fork 63 for transfer.

For example, the back-surface camera 131 is placed in a front-side portion of the substrate 110, and captures an image of the front (the direction in which the fork 63 is inserted, and the direction to see the slot 201 from the front). The back-surface camera 132 is placed in a front-side portion of the substrate 110, and captures an image of the right (the direction to see the slot 201 from the side). The back-surface camera 133 is placed in a right-side portion of the substrate 110, and captures an image of the right (the direction to see the slot 202 from the front). The back-surface camera 134 is placed in a left-side portion of the substrate 110, and captures an image of the left (the direction to see the slot 203 from the front). The back-surface camera 135 is located in a center portion of the substrate 110, and captures an image of the rear (the direction in which the fork 63 is pulled out).

Here, the fork 63 has a base 631 and branches 632 and 633 that branch out from the base 631. The back-surface cameras 131 to 135 are placed in positions where, when the fork is 63 inserted under the measurement jig 101 to lift and transfer the measurement jig 101, the back-surface cameras 131 to 135 and the fork 63 do not interfere with each other.

The front-surface cameras 121 to 126 and the back-surface cameras 131 to 135 can confirm the teaching positions upon teaching, which will be described later, detect the tilt (for example, the horizontal tilt, vertical tilt, etc.) at each teaching position, detect a deviation from the design data on the CPS, and so forth.

Note that the front-surface cameras 121 to 126 and the back-surface cameras 131 to 135 may include a light source that provides supplemental lighting.

The level 140 is placed on the front surface of the substrate 110, and detects the tilt angle of the substrate 110. For the level 140, for example, a sensor that measures the triaxial tilt angle can be used.

As will be described later, the level 140 can be used to detect the relative angular deviation at the teaching positions upon teaching, which will be described later, detect the contact position when the measurement jig 101 is lifted by the fork 63, detect the angle at which the wafer boat 50 shakes when the measurement jig 101 is delivered from the fork 63 to the wafer boat 50 or when the measurement jig 101 is received from the wafer boat 50 in the fork 63.

The vibration sensors 151 and 152 are placed on the front surface of the substrate 110, and detect the vibration of the substrate 110. For the vibration sensors 151 and 152, for example, acceleration sensors can be used. Also, the vibration sensor 151 is placed ahead of the center of the substrate 110, and the vibration sensor 152 is placed behind the center of the substrate 110.

The vibration sensors 151 and 152 can be used to detect a failure of the substrate processing device 104 in advance, determine an appropriate transfer speed of the measurement jig 101, and so forth.

The jig controller 160 is placed on the front surface of the substrate 110. The image data captured by the front-surface cameras 121 to 126, the image data captured by the back-surface cameras 131 to 135, the data acquired by the level 140, and the data acquired by the vibration sensors 151 and 152 are input to the jig controller 160. Also, the jig controller 160 has a function of analyzing the input data. Also, the jig controller 160 has a function of image-processing the image data. Also, the jig controller 160 has a function of storing the input data. Also, the jig controller 160 has a function of communicating with the analysis controller 102.

The battery 170 is placed on the front surface of the substrate 110, and supplies the electric power for operating the front-surface cameras 121 to 126, the back-surface cameras 131 to 135, the level 140, the vibration sensors 151 and 152, and the jig controller 160.

Here, the substrate processing system 100 shown in FIG. 1 has an analysis controller 102 for implementing the CPS (Cyber Physical System). The analysis controller 102 holds the design data of the substrate processing system 100, as data for the cyber side, and holds position information based on the design data.

Nevertheless, given actual devices, transfer operation strictly in accordance with the design values is not possible due to mechanical variation in the parts of the devices, variation that is introduced upon installation of the devices, and/or other factors. The substrate processing system 100 according to the present embodiment operates on the premise of design values, taking into account the actual mechanical variation measured by using the measurement jig 101, so that teaching is made possible.

<FIMS Teaching>

Figure 6:
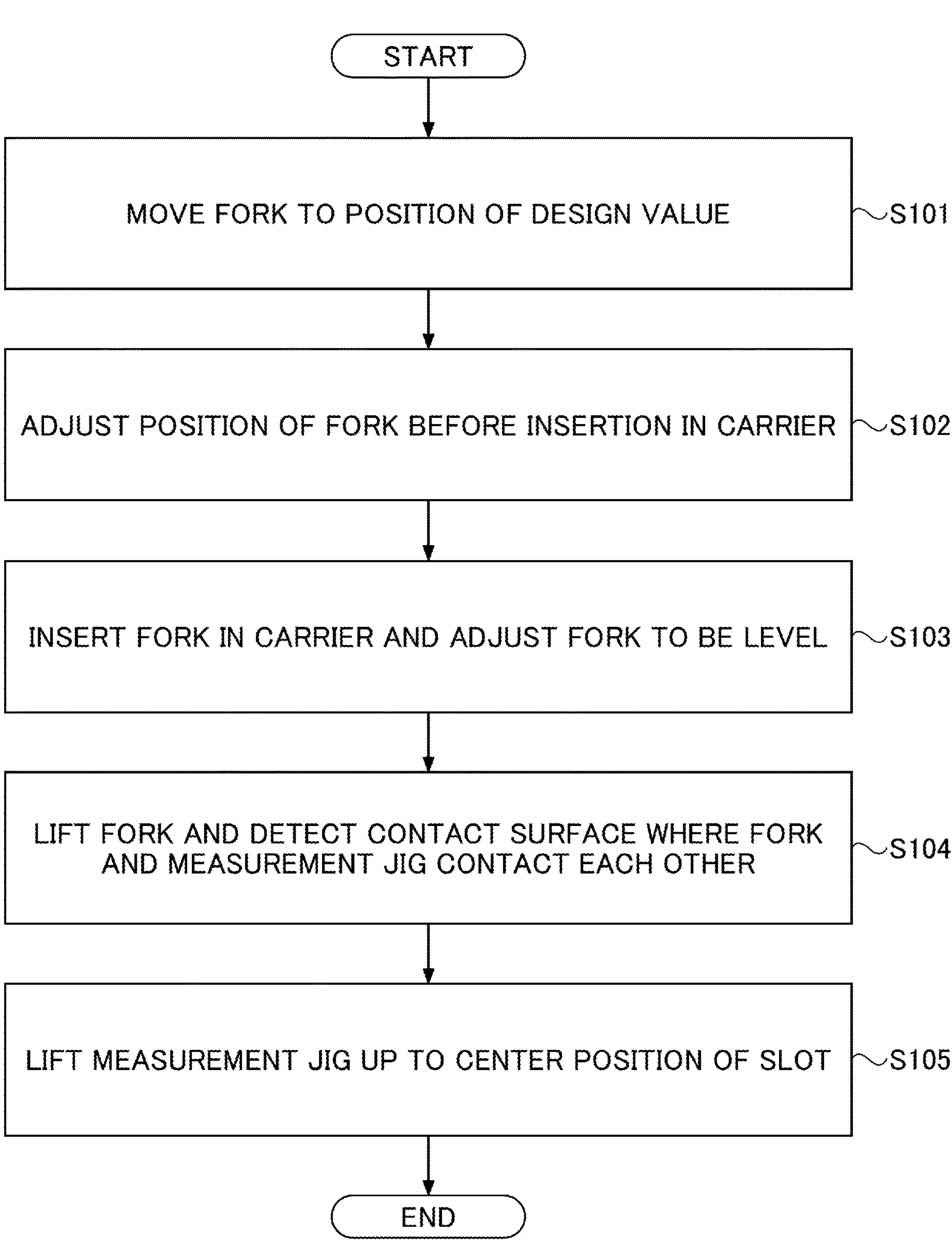
FIG. 6 is an example flow chart of FIMS teaching.

Next, the teaching process using the measurement jig 101 will be described using FIG. 6. FIG. 6 is an example flowchart of FIMS teaching.

Here, the operation upon receiving a wafer W (measurement jig 101) from a carrier C held in an FIMS port 24 is the target of teaching.

Before the flow of FIG. 6 is started, a carrier C is loaded on an FIMS port 24, with the measurement jig 101 held in the carrier C.

In step S101, the fork 63 is moved to the position of the design value. Here, the device controller 103 controls the wafer transfer device 60 to move the fork 63 to the position of the design value before the fork 63 is inserted in the carrier C.

In step S102, the position of the fork 63 before being inserted in the carrier C is adjusted.

First, the jig controller 160 controls the back-surface camera 135 to capture images of the substrate 110 and the fork 63, and transmit the captured image data to the analysis controller 102. The analysis controller 102 image-processes the images captured by the back-surface camera 135, and measure the center position of the fork 63 in the width direction (the left-right direction). Also, the analysis controller 102 image-processes the images captured by the back-surface camera 135, and measures the height at which the fork 63 is to be inserted (the height from the upper surface of the fork 63 to the lower surface of the substrate 110).

Then, the analysis controller 102 teaches the position of the fork 63 before the fork 63 is inserted in the carrier C, based on: the position of the fork 63 before the fork 63 is inserted in the carrier C according to the design value; the center position of the fork 63 as measured in the width direction; and the height at which the fork 63 is inserted. Then, the analysis controller 102 indicates the taught position to the device controller 103. The device controller 103 controls the wafer transfer device 60 to move the fork 63 to the taught position.

In step S103, the fork 63 is inserted in the carrier C, and the fork 63 is adjusted to be level.

First, the device controller 103 controls the wafer transfer device 60 to move the fork 63 forward, and inserts the fork 63 under the measurement jig 101. Here, the jig controller 160 controls the back-surface camera 132 to capture images of the substrate 110 and the tip of the branch 633 of the fork 63. Also, the jig controller 160 controls the back-surface camera 135 to capture images of the substrate 110 and the base 631 of the fork 63. Also, the device controller 103 transmits the captured image data to the analysis controller 102. The analysis controller 102 image-processes the images captured by the back-surface camera 132 and the back-surface camera 135, and measures the position of the fork 63 in the forward direction.

Then, when the fork 63 reaches a predetermined position in the forward direction, the analysis controller 102 stops the forward movement of the fork 63 via the device controller 103. Also, the analysis controller 102 teaches the forward position of the fork 63.

Next, the jig controller 160 controls the back-surface camera 135 to capture images of the substrate 110 and the base 631 of the fork 63. Also, the jig controller 160 controls the back-surface camera 132 to capture images of the substrate 110 and the tip of the branch 633 of the fork 63. Also, the device controller 103 transmits the captured image data to the analysis controller 102. The analysis controller 102 image-processes the images captured by the back-surface camera 135, and measures the height at which the rear portion of the fork 63 is inserted. Also, the analysis controller 102 image-processes the images captured by the back-surface camera 132, and measures the height at which the front portion of the fork 63 is inserted. The analysis controller 102 measures the amount by which the fork 63 drops (pitch angle), based on the difference between the height at which the rear portion of the fork 63 is inserted and the height at which the front portion of the fork 63 is inserted.

Then, the analysis controller 102 indicates, based on the measured amount by which the fork 63 drops, an amount of offset to make the fork 63 level, to the device controller 103. The device controller 103 controls the pitch angle of the wafer transfer device 60 based on the offset amount indicated by the analysis controller 102. This makes the fork 63 level to the substrate 110.

In step S104, the fork 63 is lifted up to detect the contact surface where the fork 63 and the measurement jig 101 contact each other.

First, the device controller 103 controls the wafer transfer device 60 to lift the fork 63 gradually. The analysis controller 102 uses the data from front-surface cameras 121 to 126, the back-surface cameras 131 to 135, the level 140, and the vibration sensors 151 and 152, transmitted from the jig controller 160, in combinations, and detects the contact surface accurately. For example, the contact surface may be detected based on the images of the slot 201 and the substrate 110 captured by the front-surface camera 121 and the back-surface camera 131. Also, the contact surface may be detected based on the images of the fork 63 and the substrate 110 captured by the back-surface cameras 132 and 134. Also, the contact surface may be detected by detecting the vibration of the substrate 110 by using the vibration sensors 151 and 152, when the fork 63 is brought into contact with the measurement jig 101. Also, the contact surface may be detected by detecting the tilt of the substrate 110, by using the level 140, when the fork 63 is brought into contact with the measurement jig 101 and the measurement jig 101 is lifted by the fork 63.

Also, the analysis controller 102 confirms that the substrate 110 is properly placed at a predetermined position on the fork 63, based on the images of the fork 63 and the substrate 110 captured by the back-surface cameras 132 and 134.

In step S105, the measurement jig 101 is lifted to the center position of the slot. Following step S104, the device controller 103 controls the wafer transfer device 60 to lift the fork 63 gradually. The jig controller 160 captures images of the position of the substrate 110 in the slot S201 by using the front-surface camera 121 and the back-surface camera 131. Similarly, the front-surface camera 123 and the back-surface camera 133 capture images of the position of the substrate 110 in the slot S202. Similarly, the front-surface camera 125 and the back-surface camera 134 capture images of the position of the substrate 110 in the slot S203. The analysis controller 102 image-processes the images transmitted from the jig controller 160, and detects the clearances of the slots 201 to 203. When the analysis controller 102 determines that the substrate 110 has been lifted up to the center position of the slots 201 to 203, the analysis controller 102 stops the lifting of the fork 63 via the device controller 103. Also, the analysis controller 102 teaches the position of the fork 63.

In doing so, the jig controller 160 checks the degree of leveling between the FIMS port 24 and the fork 63 based on the data of the level 140. If the degree of leveling exceeds a threshold, an alarm may be issued to adjust the leveling.

This concludes the teaching at the FIMS port 24. By this means, when taking out the wafers W held in the carrier C, the device controller 103 can take out the wafers W by moving the fork 63 to the position taught in step S102, moving the fork 63 forward to the position taught in step S103, lifting the fork 63 to the position taught in step S105, and, after that, moving the fork 63 backward.

<Boat Teaching>

Next, another teaching process using the measurement jig 101 will be described below with reference to FIG. 7.

Figure 7:
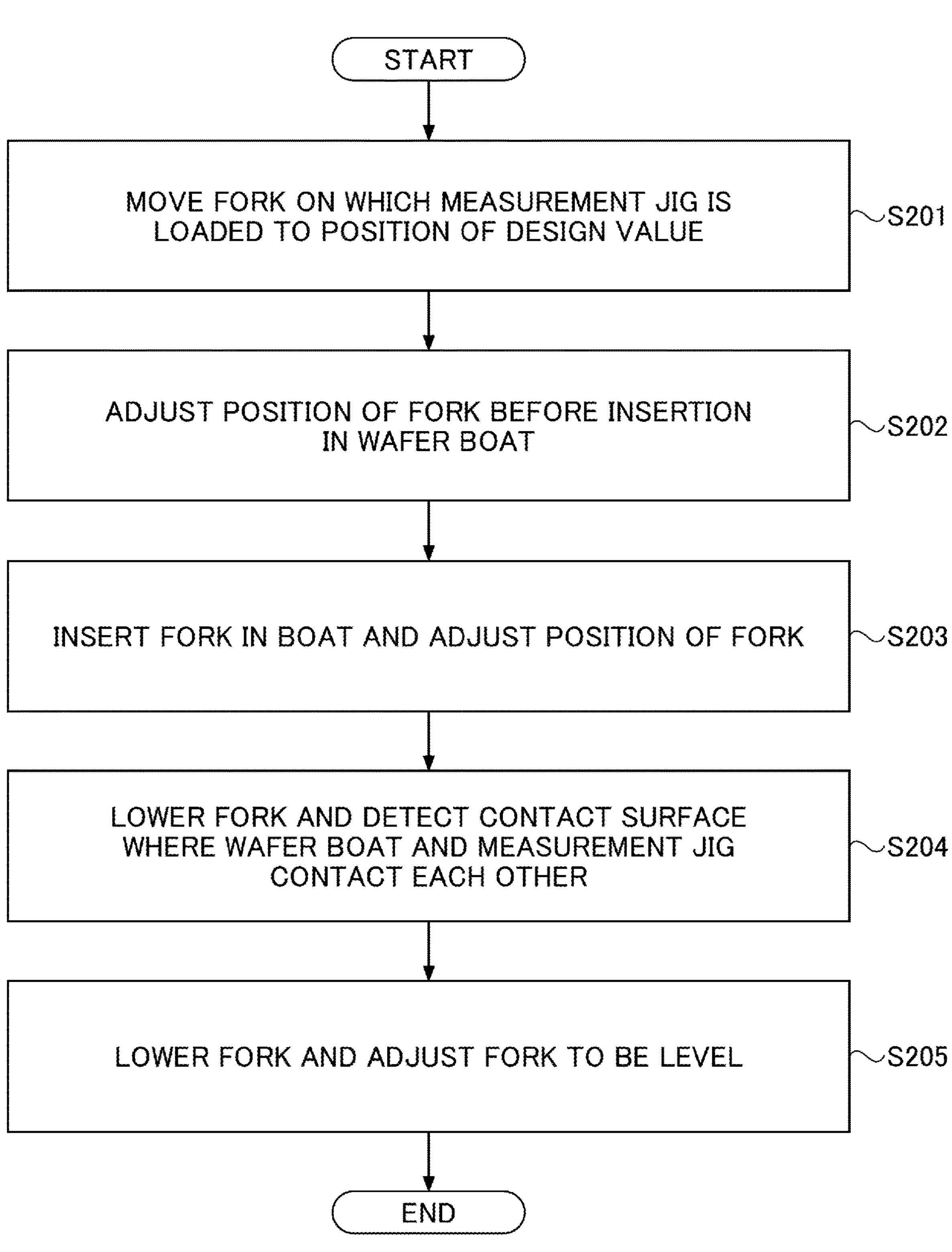
FIG. 7 is an example flow chart of boat teaching.

FIG. 7 is an example flow chart for boat teaching.

Here, the operation when a wafer W (measurement jig 101) is delivered to a wafer boat 50 will be taught. Note that, before the flow of FIG. 7 is started, the measurement jig 101 is loaded on a fork 63.

In step S201, the fork 63, on which the measurement jig 101 is loaded, is moved to the position of the design value. Here, the device controller 103 controls the wafer transfer device 60 to move the fork 63 to the position of the design value before the fork 63 is inserted in the wafer boat 50.

In step S202, the position of the fork 63 before being inserted in the wafer boat 50 is adjusted.

First, the jig controller 160 captures images of the slots of the wafer boat 50 by using the front-surface cameras 121, 124 and 126 and the back-surface cameras 131, 133 and 134, and transmits the captured images to the analysis controller 102. The analysis controller 102 adjusts the position of the fork 63 in height and the left-right direction based on the captured images so that, when the fork 63 is moved forward, the fork 63 can be inserted without contacting the slots of the wafer boat 50 with the measurement jig 101. By this means, the analysis controller 102 teaches the adjusted position of the fork 63.

In step S203, the fork 63 is inserted in the wafer boat 50, and the position of the fork 63 is adjusted.

Here, the analysis controller 102 adjusts the position of the measurement jig 101 in the left-right direction based on the images of the slots 201 to 203 of the wafer boat 50, captured by the front-surface camera 121 and the back-surface camera 131, which are provided in front portions of the substrate 110 to capture images of the front, and the front-surface cameras 124 and 126, which are provided in left and right portions of the substrate 110 to capture images of the front.

Also, the analysis controller 102 adjusts the upper/lower position of the measurement jig 101 so that the substrate 110 does not contact the slots, based on the images of the slot 201 of the wafer boat 50 captured by the front-surface camera 121 and the back-surface camera 131, which are provided in front portions of the substrate 110 to capture images of the front.

Also, the analysis controller 102 adjusts the front and rear axial positions of the measurement jig 101 for insertion in the slots based on the horizontal (radial) clearance between the slot 201 and the substrate 110 captured by the front-surface camera 122 or the back-surface camera 132, the horizontal (radial) clearance between the slot 202 and the substrate 110 captured by the front-surface camera 124, and the horizontal (radial) clearance between the slot 203 and the substrate 110 captured by the front-surface camera 126.

Also, the analysis controller 102 detects the upper and lower clearances between the slots 201 to 203 and the substrate 110 by using the front-surface cameras 121, 123, and 125 and the back-surface cameras 131, 133, and 134, and adjusts the positions of the vertical axis so that the clearances are maximized.

By this means, the analysis controller 102 teaches the adjusted position of the fork 63.

In step S204, the fork 63 is lowered to detect the contact surface where the wafer boat 50 and the measurement jig 101 contact each other. Here, as in step S104, the analysis controller 102 detect the contact surface by using the data from the front-surface cameras 121 to 126, the back-surface cameras 131 to 135, level 140, and the vibration sensors 151 and 152, transmitted from the jig controller 160, in combinations.

In step S205, the fork 63 is lowered and adjusted to be level. Here, as in step S103, the jig controller 160 finds the difference in the height at which the fork 63 is inserted, based on the images captured by the back-surface camera 135 and the back-surface camera 132, and measures the amount by which the fork 63 drops (pitch angle).

At this time, the jig controller 160 checks the degree of leveling of the wafer boat 50 and the fork 63 based on the data of the level 140. If the degree of leveling exceeds a threshold, an alarm may be issued to adjust the leveling.

This concludes the teaching in the wafer boat 50. By this means, when transferring the wafer W to the slots of the wafer boat 50, the device controller 103 moves the fork 63 to the position taught in step S202, moves the fork 63 forward up to the position taught in step S203, lowers the fork 63 to a position lower than the contact surface detected in step S204, and then moves the fork 63 backward, thereby holding the wafer W in the wafer boat 50.

<Adjustment of Wafer Transfer Speed>

Figure 8:
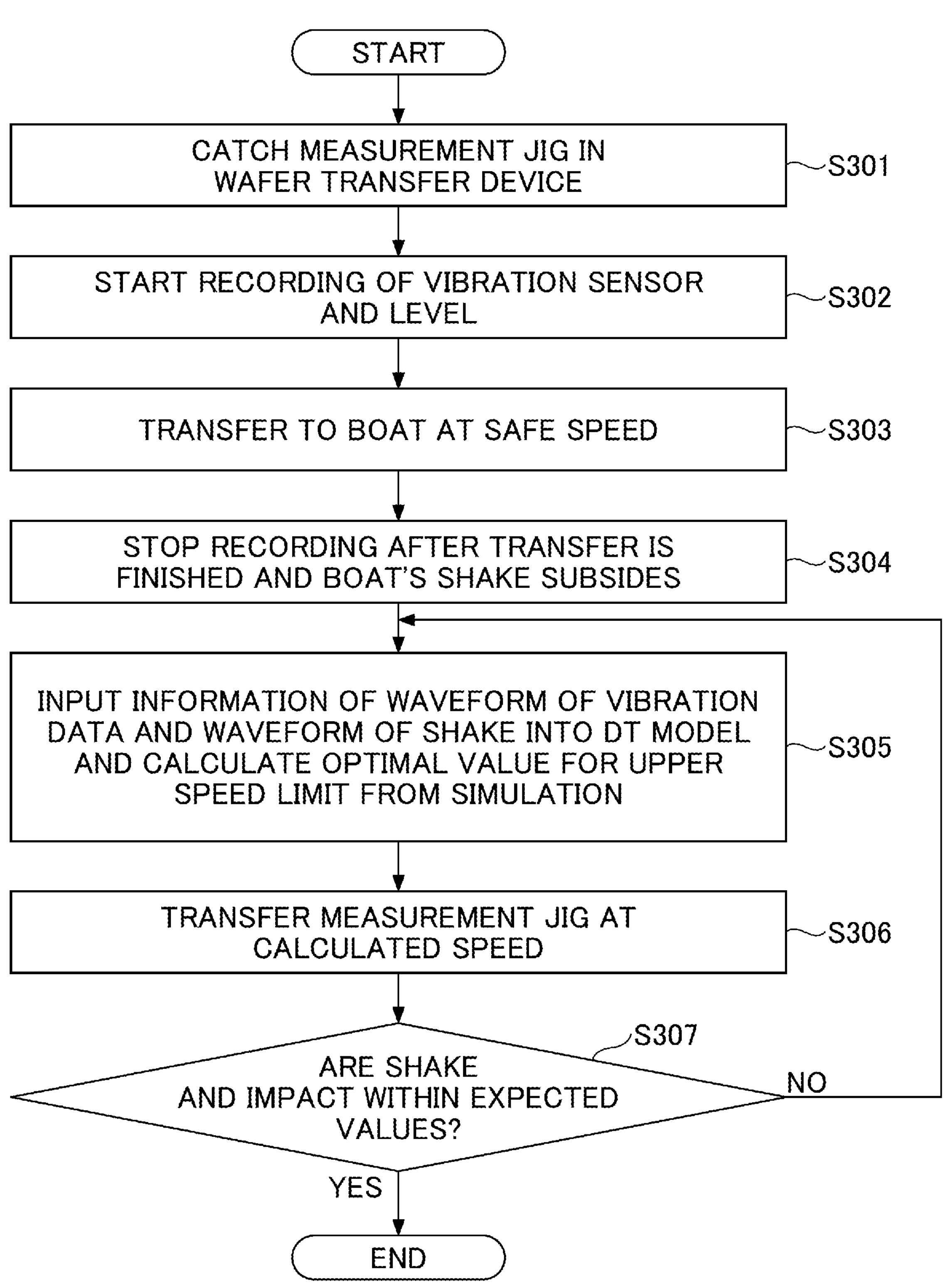
FIG. 8 is an example flowchart for adjusting the speed for transferring wafers.

Next, another teaching process using the measurement jig 101 will be described using FIG. 8. FIG. 8 is an example flowchart for adjusting a wafer's transfer speed.

In step S301, the measurement jig 101 is caught by the fork 63 of the wafer transfer device 60. By moving the fork 63 following the taught positions, the device controller 103 allows the fork 63 to catch the measurement jig 101 from the carrier C held in the FIMS port 24.

In step S302, the jig controller 160 starts recording of the vibration sensors 151 and 152 and the level 140.

In step S303, the device controller 103 moves the fork 63, and transfers the measurement jig 101 to the wafer boat 50 at a safe speed. Here, the safe speed refers to a speed at which the measurement jig 101 can be transferred to the wafer boat 50 properly.

In step S304, after the transfer is finished and the wafer boat 50's vibration has subsided, the jig controller 160 ends the recording. Then, the jig controller 160 transmits the recorded data to the analysis controller 102. Note that the end of recording may be determined by the analysis controller 102.

In step S305, the analysis controller 102 inputs information of the waveform of the vibration data and the waveform of the shake into the DT model, and calculates an optimal value for the upper speed limit, from a simulation. Here, the maximum vibration angle of the wafer boat 50 when the wafer W is delivered to the wafer boat 50 and the time it takes until the shaking of the wafer boat 50 subsides are calculated, and the maximum transfer speed at which the wafer W can be transferred without suffering impact is calculated.

In step S306, the device controller 103 transfers the measurement jig 101 at the calculated speed. The jig controller 160 measures the shaking and the like by using the level 140 and the vibration sensors 151 and 152. Note that, as for the speed of transfer, the measurement jig 101 may be transferred at a speed that presumes the difference in weight between the measurement jig 101 and the wafer W.

In step S307, the analysis controller 102 determines whether or not the shaking or the impact is within the expected values. If the shaking or the impact is not within the expected values (S307: No), the analysis controller 102 returns to step S305 and starts over from the simulation. When the shaking or the impact is within the expected values (S307: Yes), the analysis controller 102 ends the process.

By this means, when transferring the wafer W to the wafer boat 50, it is possible to set the transfer speed so that the wafer W is prevented from getting scratches.

<Determination of Wafer Boat Deformation and Transfer Method>

Figure 9:
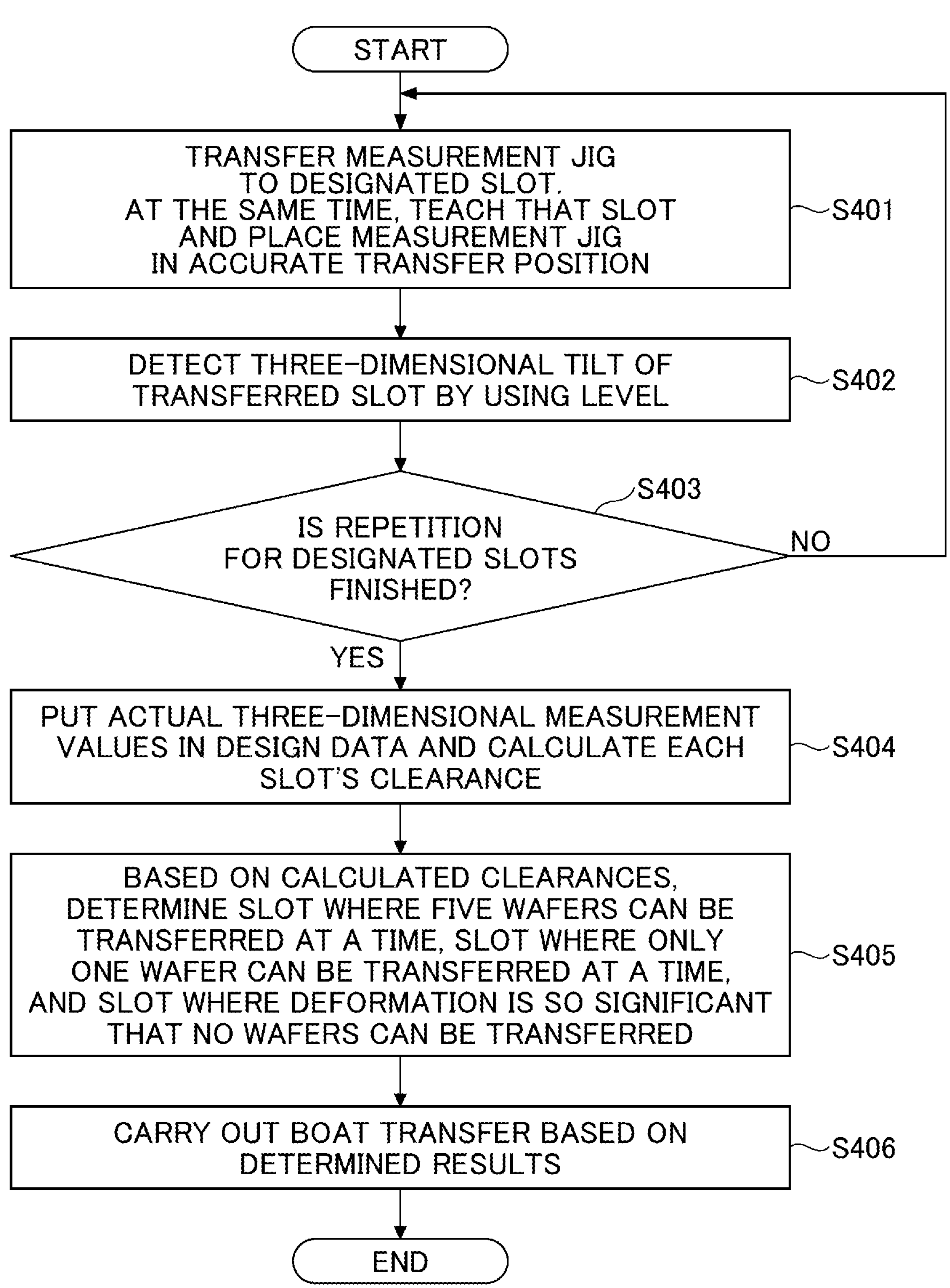
FIG. 9 is an example flowchart for detecting the misalignment of the wafer boat and adjusting the method of transferring wafers.

Next, another teaching process using the measurement jig 101 will be described below with reference to FIG. 9. FIG. 9 is an example flowchart for detecting the deformation of a wafer boat 50 and adjusting the method of transferring a wafer W.

In step S401, the device controller 103 moves a fork 63, and transfers the measurement jig 101 to the designated slots of the wafer boat 50. Note that these slots are taught at the same time, and the measurement jig 101 is placed at accurate transfer positions.

In step S402, the jig controller 160 detects the three-dimensional tilts of the slots where the measurement jig 101 is transferred, by using the level 140.

In step S403, whether the detection has been repeated for all the designated slots is determined. If the detection has not been repeated for the designated slots (S403: No), the device controller 103 transfers the measurement jig 101 to the next slot (S401) and detects the tilt (S402), until the detection is completed for all of the designated slots. When the detection is repeated for the designated slots (S403: Yes), the process proceeds to step S404.

In step S404, the analysis controller 102 calculates the clearance of each slot by inputting the actual three-dimensional measured values measured by using the measurement jig 101, into the design data of the wafer boat 50 stored in advance.

In step S405, the analysis controller 102 determines, based on the calculated clearances, for example, a slot where five wafers W can be transferred, a slot where only one wafer W can be transferred, a slot where the deformation is so significant that no wafers W can be transferred, and so forth.

In step S406, the device controller 103 transfers the wafers W to the wafer boat 50 based on the results determined in step S405. Also, the analysis controller 102 adjusts the teaching positions based on the measured deformation of the wafer boat 50, and the device controller 103 transfers the wafers W based on the adjusted teaching positions.

By this means, even when the wafer boat 50 is deformed due to high temperature heat treatment or the like, it is still possible to objectively identify the slots of the wafer boat 50 that are not suitable for use. Also, depending on the condition of each slot, the number of wafers W to transfer at a time can be adjusted.

<Advance Detection of Failures>

Next, the advance failure detection of the substrate processing device 104 using the measurement jig 101 will be described.

The measurement jig 101 is placed in the substrate processing device 104 in a predetermined cycle (for example, about once a month) to allow the vibration sensors 151 and 152 and the level 140 to acquire information about the vibration that is produced when each device's drive axis is operated, and to allow the analysis controller 102 to detect failures in advance.

For example, in the carrier transfer mechanism 30, each movable axis (the vertical axis, the horizontal axis, and the longitudinal axis) is operated one by one, with the measurement jig 101 inserted in the carrier C, and the vibration thereupon and so forth are acquired. Also, in the wafer transfer device 60, the measurement jig 101 is loaded on the fork 63, and each movable axis (the vertical axis, the rotation axis, the pitch axis, and the longitudinal axis of each fork) is operated one by one, and the vibration thereupon and so forth are acquired. Also, in the boat carrier (not shown) for transferring the wafer boat 50, each movable axis (the vertical axis, the rotation axis, and the longitudinal axis) is operated one by one, with the measurement jig 101 inserted in the wafer boat 50, and the vibration thereupon and so forth are acquired. Also, in the boat elevator (not shown) for lifting and lowering the wafer boat 50, each movable axis (the vertical axis and the rotation axis) is operated one by one, with the measurement jig 101 inserted in the wafer boat 50, and the vibration thereupon and so forth are acquired.

The analysis controller 102 detects failures in advance based on the measured vibrations and the like. By this means, it is possible to detect in advance the risk of failures before the devices fail, so that repair plans can be made in advance, and the downtime of the substrate processing device 104 can be reduced.

Also, in the measurement jig 101, the vibration sensors 151 and 152 are provided individually in the front-rear direction. Now, when a cantilever-supported fork 63 vibrates, the vibration is large near the tip of the fork 63 and small near the base of the fork 63. It then follows that, by calculating the difference between the detected values of the vibration sensors 151 and 152 provided in the front-rear direction, it is possible to acquire vibration information by separating between two vibrations, namely the vibration of the wafer transfer device 60's main body and the vibration of the fork 63 alone. This makes it possible to detect a wide range of failures. For example, it is possible to accumulate and keep the difference between these two vibrations as data, and use this data to detect improper attachment of the fork 63 in advance, because, when the difference is large, there is a possibility that the fork 63 itself of the wafer transfer device 60 holding the wafers W is improperly installed (due to, for example, loose screwing, cracks, etc.).

Also, failure prediction using the vibration sensors 151 and 152 and the level 140 can be used to predict when the vertical axis of the wafer transfer device 60 or the boat elevator will run out of grease, to predict when the bearings of each part will run out of grease or be damaged, to predict when particles are produced due to running out of grease or loosening of the belt, to predict when particles are produced due to defective sealing of the boat elevator's rotation axis, to predict the degree of wear of the racks and the pinion mechanism in the carrier transfer mechanism 30 and generation of particles, to predict loosening of linear rails as seen from the horizontal changes of each axis, to predict loosening of the fork 63 of the wafer transfer device 60, and so forth.

Note that the analysis controller 102 predicts the vibration of each part in a simulation on the CPS by using the Digital Twin system, and detects failures from the differences between the vibrations according to the simulation and the vibrations detected by the measurement jig 101. Also, the analysis controller 102 may identify a feature for detecting failures and predict failures by a statistical method based on the vibrations detected by the measurement jig 101.

Also, auto-teaching may be performed regularly by using the measurement jig 101, and the corrections of errors from the design values may be recorded and accumulated, so that failures may be detected in advance at teaching locations. For example, auto-teaching may be performed at the same time with the failure detection by the vibration sensors 151 and 152 of the measurement jig 101. In doing so, the amounts of corrections from the design values necessitated by the auto-teaching may be kept on record, so that, when there is a location where the amount of correction increases or when there is such an axis, it may be possible to determine that a failure might occur there later (due to loosening of screws, deformation of linear rails, damage to bearings, etc.).

Also, conventional maintenance work such as failure detection and teaching had to be performed manually by the operator by stopping the production by the substrate processing device 104 (processing of wafers W) and switching to maintenance mode. In contrast to this, when the measurement jig 101 is used, the substrate processing device 104's self-diagnosis, auto-teaching, and so forth can be performed automatically by making use of the time in which the substrate processing device 104 is unoccupied. Note that the timing for performing self-diagnosis or auto-teaching while production is in progress may be, for example, indicated by a higher-level control device (not shown), or a timing when there are no production-lot wafers W in the substrate processing device 104 may be identified by a scheduler in the device controller 103.

Also, the analysis controller 102 constantly simulates changes in vibration with respect to the mileage of the driver, the duration of use, and so forth, on the cyber side, by using the digital twin-based CPS. By this means, in parallel with the actual device, a device that accurately simulates, for example, the driver's movement and duration of use, the cumulative weight, the amount of wafers W carried, the number of carriers C, and so forth reproduced on a digital-twin simulator. Taking this this actual amount of use into consideration, it is possible to compare between the simulated vibration data and the actual vibration data, and determine, if the difference exceeds a tolerable level, that the situation is abnormal, so that a failure can be detected in advance.

Also, when installing each device in the substrate processing device 104, the measurement jig 101 can be used to objectively identify the variation that is introduced upon installation of each device, thereby bringing each device's installation position close to its designed position, and thus enabling accurate installation. For example, assuming that the measurement jig 101 is to be installed in a device, the position of the device may be adjusted with the measurement jig 101 placed on the device, thereby ensuring the accuracy of the position of installation. Also, the final data at the end of the adjustment may be kept and later used as a basis for detecting errors from the design data. Also, by using the measurement results obtained by using the measurement jig 101, the inspection report at the end of installation of the device can be issued automatically at the end of the installation work.

It is also possible to hold the measurement jig 101 inside the carrier C of the stocker 16, and capture images of the inside of the substrate processing device 104 with the measurement jig 101, so that a variety of scan sensors can be substituted. Also, in the event an abnormality occurs inside the substrate processing device 104, the measurement jig 101 can capture the images inside.

Also, conventional teaching work and operation check had to be performed during maintenance. In contrast to this, by using the measurement jig 101, information about the production plan of the substrate processing device 104 can be obtained from a higher-level management device, and auto-teaching and advance failure detection can be executed automatically at the timing the substrate processing device 104 becomes idle. As for the timing, frequency, conditions, and so forth of the automatic execution, the operator, higher-level management device, and the like can set these in advance. In doing so, it is also possible to ask the higher-level management device to carry in the measurement jig 101 into the substrate processing device 104, or take out the measurement jig 101 from the stocker in the substrate processing device 104. As this makes it possible diagnose the device or make re-teaching while regular production is in progress, without waiting for maintenance timing, it is possible to reduce the failure rate and troubles with the substrate processing device 104, enable autonomous control and extended duration of operation of the substrate processing device 104, and reduce the scratches and generation of particles.

Although the substrate processing system 100 has been described above, the present disclosure is by no means limited to the above-described embodiment and the like, and a variety of alterations and improvements can be made within the scope of the present disclosure described in the following claims.

The present application is based on and claims priority to Japanese patent application No. 2021-096190, filed with Japanese Patent Office on Jun. 8, 2021, the entire contents of which are hereby incorporated by reference.

What is claimed is:

1. A measurement jig comprising:

a substrate;

an upper-surface camera protruding upward from an upper surface of the substrate along a direction of gravity of the substrate;

a lower-surface camera located in a center of a lower surface of the substrate, the lower surface being a surface of the substrate opposite to the upper surface, the lower-surface camera having an image capturing surface protruding downward from the lower surface of the substrate along the direction of gravity of the substrate, the image capturing surface facing toward a rear relative to the center of the lower surface of the substrate in a front-rear direction, the lower-surface camera configured to capture an image at the rear in the front-rear direction parallel to an extending direction of the substrate, the front-rear direction being a direction in which the substrate is inserted in and removed from a slot that is an opening for the substrate to be held; and a controller configured to control the upper-surface camera and the lower-surface camera, and measure a height from an upper surface of a fork to the lower surface of the substrate in a height direction perpendicular to the extending direction of the substrate, the fork configured to be inserted under the substrate to transfer the substrate.

2. The measurement jig according to claim 1, wherein the lower surface of the substrate is a surface facing downwards with respect to the direction of gravity of the substrate.

3. The measurement jig according to claim 1, wherein, when the substrate is disposed on a boat, the lower surface of the substrate is brought into contact with the boat.

4. The measurement jig according to claim 1, further comprising an additional lower-surface camera located in a front portion of the lower surface of the substrate in the front-rear direction, wherein the lower-surface camera is configured to capture an image of a vicinity of a base of the fork, and wherein the additional lower-surface camera is configured to capture an image of a vicinity of a tip of the fork.

5. The measurement jig according to claim 1, further comprising a vibration sensor, a tilt sensor, or any combination thereof that is controlled by the controller.

6. The measurement jig according to claim 1, further comprising two additional lower-surface cameras located on opposite sides relative to the center of the lower surface of the substrate, the additional lower-surface cameras configured to capture an image in a direction different from the front-rear direction.

7. The measurement jig according to claim 1, further comprising an additional lower-surface camera located in a front portion of the lower surface of the substrate in the front-rear direction, the additional lower-surface camera configured to capture an image at a front relative to the center of the lower surface of the substrate in the front-rear direction.

8. The measurement jig according to claim 1, wherein a clearance between the slot and the substrate along the direction of gravity of the substrate is detected by the upper-surface camera and the lower-surface camera.

9. A processing method comprising:

capturing an image of a fork of a transfer device before insertion, by using a lower-surface camera located in a center of a lower surface of a substrate of a measurement jig, the lower-surface camera having an image capturing surface protruding downward from the lower surface of the substrate along a direction of gravity of the substrate, the image capturing surface facing toward a rear relative to the center of the lower surface of the substrate in a front-rear direction, the lower-surface camera configured to capture an image at the rear in the front-rear direction parallel to an extending direction of the substrate, the front-rear direction being a direction in which the substrate is inserted in and removed from a slot that is an opening for the substrate to be held;

capturing an image by using an upper-surface camera protruding upward from the upper surface of the substrate along the direction of gravity of the substrate, the upper surface being opposite to the lower surface;

measuring a center of the fork in a width direction of the fork, and a height from an upper surface of the fork to the lower surface of the substrate in a height direction perpendicular to the extending direction of the substrate;

adjusting a position of the fork in the width and height directions based on measurement results;

inserting the fork under the substrate; and adjusting the fork to be level based on a difference between a clearance between a tip of the fork and the substrate and a clearance between a base of the fork and the substrate.

10. A measurement jig comprising:

a substrate;

a lower-surface camera located in a center of a lower surface of the substrate, the lower-surface camera protruding downward from the lower surface of the substrate along a direction of gravity of the substrate, the lower-surface camera configured to capture an image at a rear relative to the center of the lower surface of the substrate in a front-rear direction parallel to an extending direction of the substrate, the front-rear direction being a direction in which the substrate is inserted in and removed from a slot that is an opening for the substrate to be held; and a controller configured to control the lower-surface camera to capture an image of a fork that is inserted under the substrate to transfer the substrate, measure a center of the fork in a width direction of the fork, and a height from an upper surface of the fork to the lower surface of the substrate in a height direction perpendicular to the extending direction of the substrate, and adjust positions of the fork in the width direction and the height direction based on measurement results.

* * * * *